United States Patent
Ito et al.

(10) Patent No.: US 7,046,969 B2
(45) Date of Patent: May 16, 2006

(54) MINIATURIZED TRANSMITTER-RECEIVER UNIT

(75) Inventors: Shigehiro Ito, Fukushima-ken (JP); Yoshio Saito, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 495 days.

(21) Appl. No.: 10/195,202

(22) Filed: Jul. 15, 2002

(65) Prior Publication Data

US 2003/0027532 A1 Feb. 6, 2003

(30) Foreign Application Priority Data

Jul. 17, 2001 (JP) .............................. 2001-216998

(51) Int. Cl.
*H04B 1/44* (2006.01)

(52) U.S. Cl. .................. 455/83; 455/78; 455/562.1; 455/121

(58) Field of Classification Search .................. 455/73, 455/78, 82, 83, 562.1, 575.5, 121, 193.1, 455/122, 129; 343/700, 850, 860, 777, 846
See application file for complete search history.

(56) References Cited

U.S. PATENT DOCUMENTS

| | | | |
|---|---|---|---|
| 5,610,617 A * | 3/1997 | Gans et al. ................. 455/135 |
| 5,969,681 A * | 10/1999 | O'Neill, Jr. ................. 455/283 |
| 6,195,049 B1 | 2/2001 | Kim et al. |
| 6,236,366 B1 * | 5/2001 | Yamamoto et al. ......... 455/347 |
| 6,320,543 B1 * | 11/2001 | Ohata et al. ......... 343/700 MS |
| 2003/0103006 A1 * | 6/2003 | Yamada ............... 343/700 MS |

FOREIGN PATENT DOCUMENTS

JP 2001-345419 12/2001

* cited by examiner

*Primary Examiner*—Nick Corsaro
*Assistant Examiner*—John J. Lee
(74) *Attorney, Agent, or Firm*—Brinks Hofer Gilson & Lione

(57) ABSTRACT

A transmitter-receiver unit has an antenna patch and an IF circuit, between which there is a large frequency difference, on a first side of a multilayer substrate. A high frequency circuit (including a local oscillator and a demodulation unit) except for the IF circuit is provided on a second side of the multilayer substrate. A ground conductive pattern is provided in the interior of the multilayer substrate. The circuit conductive pattern exposed at the second side of the multilayer substrate and a feeding point of the antenna patch conduct to each other through a through hole.

3 Claims, 3 Drawing Sheets

MINIATURIZED TRANSMITTER-RECEIVER UNIT

This application claims the benefit of priority to Japanese Patent Application 2001-216998, filed on Jul. 17, 2001.

BACKGROUND OF THE INVENTION

1. Field of the Invention

The present invention relates to transmitter-receiver units used in Electronic Toll Collection (ETC) systems.

2. Description of the Related Art

In ETC systems for toll roads such as turnpikes, with time-division two-way communication, transmission and reception is performed between an ETC transmitter-receiver terminal station installed at a toll booth and an ETC transmitter-receiver mounted in a vehicle using 5.8-GHz ASK modulated waves. Predetermined tolls can be collected by transmitting and receiving signals.

FIG. 4 shows an example of a transmitter-receiver circuit used in these ETC systems. FIGS. 5A and 5B show the circuit layout of a transmitter-receiver unit with the transmitter-receiver circuit shown in FIG. 4. FIG. 5A illustrates the transmitter-receiver unit viewed from one side. FIG. 5B illustrates the transmitter-receiver unit viewed from the other side.

Referring to FIG. 4, a transmitter circuit 21 includes a local oscillator 22 for generating carrier waves and a modulation unit 23. The local oscillator 22 includes an oscillator 22b controlled by a PLL (phase-locked loop) circuit 22a. The oscillator 22b oscillates at 2.9175 GHz. The oscillator signal becomes a 5.835-GHz carrier wave after passing through a frequency doubler 22c, and the carrier wave is input through a band pass filter 22d to the modulation unit 23. The carrier wave is input through a preamplifier 23a to a modulator 23b and is subjected to ASK-modulation using a modulation signal, thus becoming a transmission signal. The transmission signal is amplified by a power amplifier 23c, and the amplified transmission signal is transferred to an antenna switch 24. Since the antenna switch 24 is controlled so as to connect the power amplifier 23c to a band pass filter 25 when performing transmission, the transmission signal is output through the band pass filter 25 to an antenna 26.

In contrast, the antenna switch 24 is controlled so as to connect the band pass filter 25 to a receiver circuit 27 when performing reception. A reception signal received by the antenna 26 is input from the band pass filter 25 through the antenna switch 24 to the receiver circuit 27. The reception signal is input through a low noise amplifier 27a to a mixer 27b. A 5.835-GHz local oscillation signal, which is generated by the local oscillator 22, is input to the mixer 27b, and hence the reception signal is frequency-converted into a 40-MHz intermediate frequency (IF) signal. The IF signal passes through a band pass filter 27c and an IF amplifier 27d and is ASK-demodulated by a detector 27e. An ASK demodulation signal, which is generated as a result of demodulation, is amplified by a baseband amplifier 27f and output. The output signal is processed by a circuit at a subsequent stage (not shown).

When a transmitter-receiver unit is formed by mounting circuit components of the foregoing transmitter-receiver circuit on a circuit substrate, it is necessary to minimize crosstalk interference since 5.8-GHz signals are used to perform the transmission and reception. Because of this necessity, as shown in FIGS. 5A and 5B, a high frequency circuit including the transmitter circuit 21 (the local oscillator 23 and the modulation circuit 23) and the receiver circuit 27 is formed on one side of a circuit substrate 28, whereas the antenna 26 is formed on the other side of the circuit substrate 28. The antenna 26 is formed by providing an antenna patch 26b on an antenna substrate 26a. The antenna substrate 26a is attached to the circuit substrate 28 with double-sided adhesive tape. A feed pin 29 is soldered at a feeding point of the antenna patch 26b. The feed pin 29 penetrates through the circuit substrate 28 and is soldered at a land at an input side of the band pass filter 25, which is formed at a high frequency circuit side.

In the foregoing known transmitter-receiver unit, the antenna 26 and the high frequency circuit are separately formed on the corresponding sides of the circuit substrate 28. Thus, the radiation characteristics of the antenna 26 become less apt to be influenced by the 5.835-GHz carrier wave used by the high frequency circuit. Because all circuit components of the high frequency circuit are mounted on one side of the circuit substrate 28, dead space in the other side of the circuit substrate 28 is increased. This prevents miniaturization of the overall receiver-transmitter unit. Because the antenna substrate 26a is attached to the other side of the circuit substrate 28 using double-sided adhesive tape and power feeding to the antenna patch 26b is implemented by soldering of the feed pin 29, the components of the antenna 26 increases in number, thus increasing the cost. Due to a difference in thermal expansion coefficient between the antenna substrate 26a and the feed pin 29, the soldered feeding point may crack.

SUMMARY OF THE INVENTION

In view of the circumstances of the related art, it is an object of the present invention to provide a miniaturized transmitter-receiver unit in which the influence on the radiation characteristics of an antenna is suppressed and the structure of the antenna is simplified.

In order to achieve the foregoing objects, a transmitter-receiver unit is provided including a multilayer substrate formed by stacking a plurality of conductive patterns; an antenna patch provided on a first side of the multilayer substrate; an intermediate frequency (IF) circuit provided on the first side of the multilayer substrate; a transmitter circuit provided on a second side of the multilayer substrate; a receiver circuit provided on the second side of the multilayer substrate; a transmission-reception switching circuit provided on the second side of the multilayer substrate; and a ground conductive pattern provided in the interior of the multilayer substrate, the ground conductive pattern opposing the antenna patch. The antenna patch and a circuit conductive pattern provided on the second side of the multilayer substrate conduct to each other through a through hole.

According to a transmitter-receiver unit arranged as described above, an antenna patch and an IF circuit, between which there is a large frequency difference, are arranged on one side of a multilayer substrate. Accordingly, the transmitter-receiver unit can be miniaturized while the influence on the radiation characteristics of an antenna can be suppressed. Power is fed through a through hole to a feeding point of the antenna patch formed on one side of the multilayer substrate. Thus, the structure of the antenna can be simplified, and increases in cost can be suppressed. Also, a soldered joint is prevented from cracking.

Another conductive pattern not overlapping the antenna patch may be formed between the conductive pattern exposed at the first side of the multilayer substrate and the ground conductive pattern. Accordingly, the multilayer substrate can be reduced in thickness. Preferably, the antenna patch is formed by etching a portion of the conductive pattern exposed at the first side of the multilayer substrate.

DESCRIPTION OF THE PREFERRED EMBODIMENTS

Figure 1:
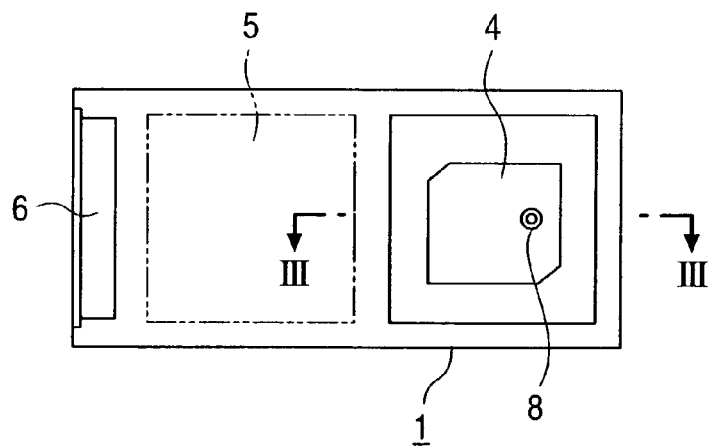
FIG. 1 is a plan view of a transmitter-receiver unit according to an embodiment of the present invention.
Figure 2:
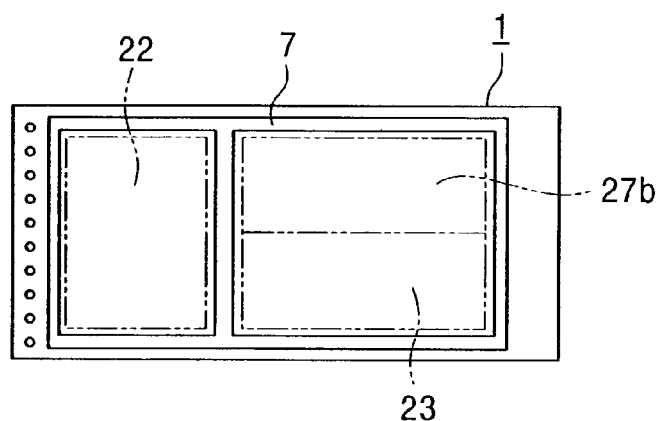
FIG. 2 is a back view of the transmitter-receiver unit.
Figure 3:
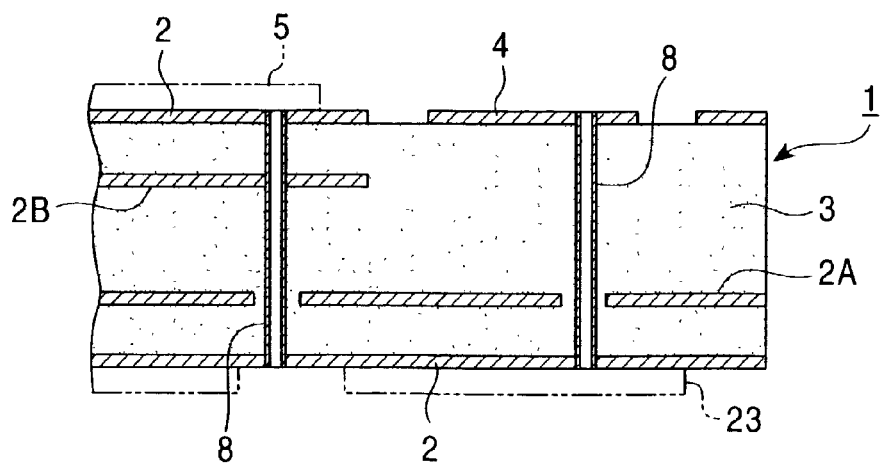
FIG. 3 is an enlarged sectional view taken along the line III—III of FIG. 1.

The present invention will become clear from the following description of the preferred embodiments with reference to the accompanying drawings. FIG. 1 shows the front side of a transmitter-receiver unit according to an embodiment of the present invention. FIG. 2 shows the rear side of the transmitter-receiver unit. FIG. 3 is an enlarged sectional view taken along the line III—III of FIG. 1.

Figure 4:
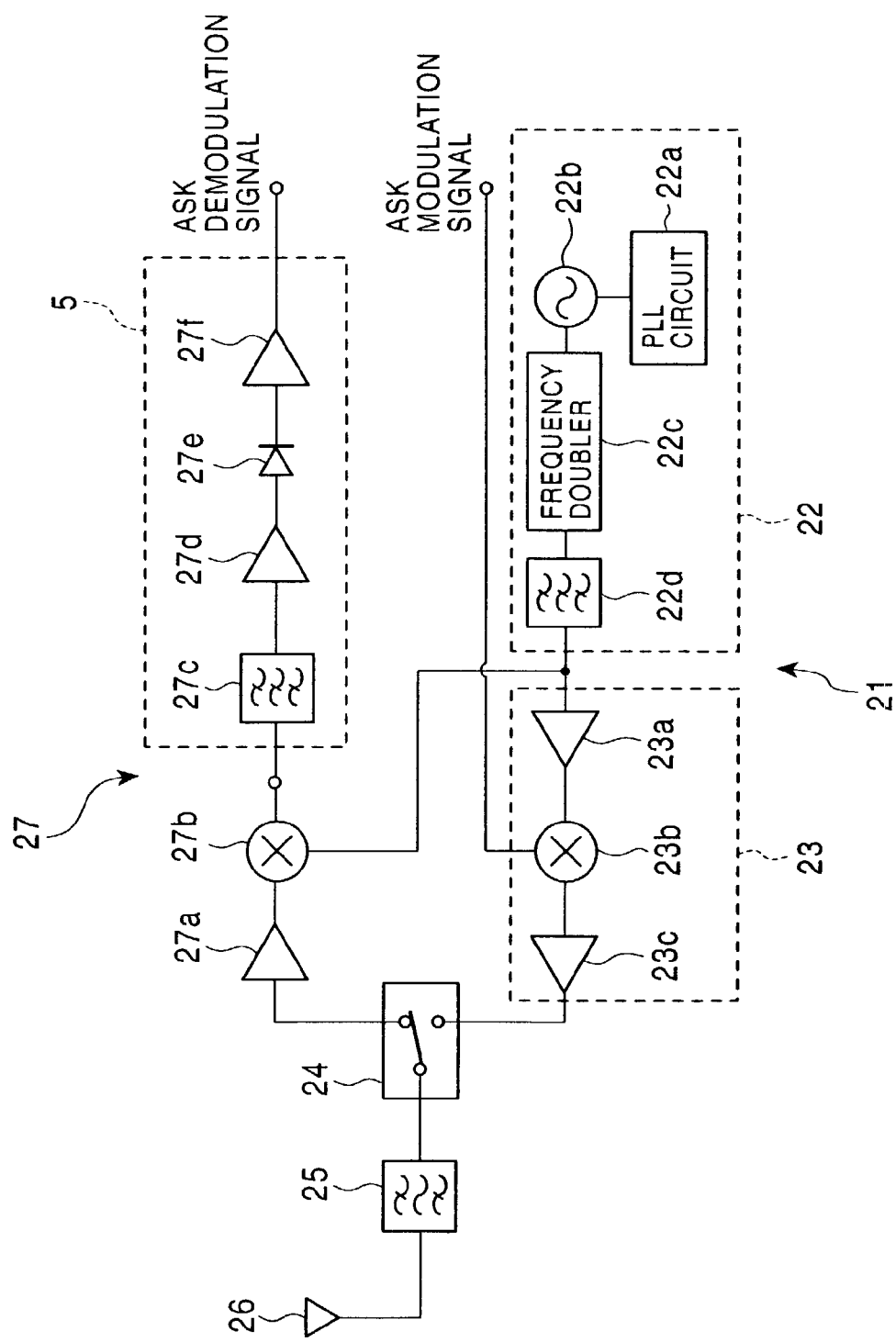
FIG. 4 is a block diagram of an example of a transmitter-receiver circuit used in an ETC system.
Figure 5A:
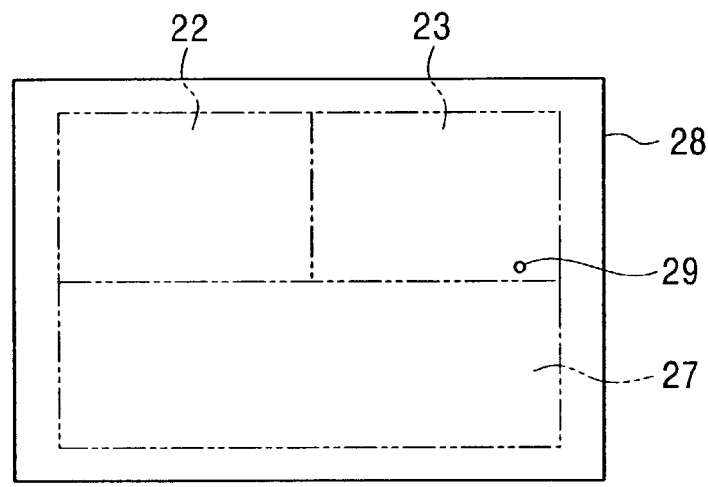
FIGS. 5A and 5B illustrate the circuit layout of a transmitter-receiver unit according to a known example.
Figure 5B:
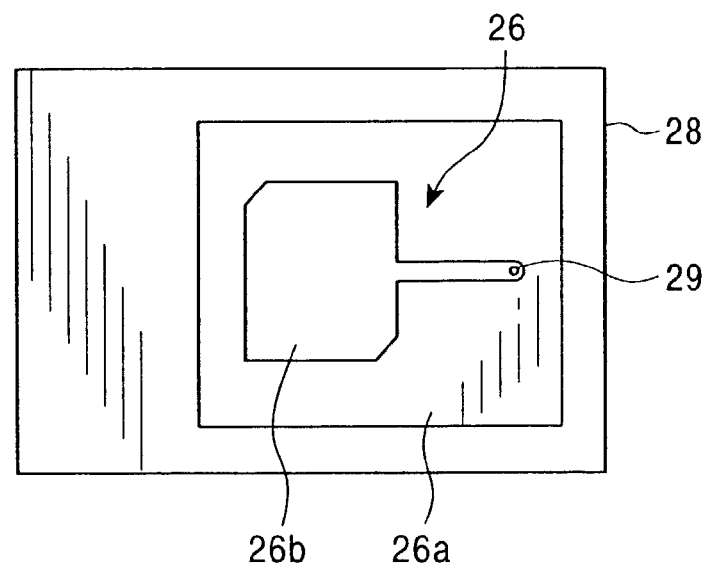

Referring to FIGS. 1 to 3, a multilayer substrate 1, which is used as a circuit substrate, will now be described. The multilayer substrate 1 is formed by stacking a plurality of conductive patterns 2, which are formed of copper foil, and insulating layers 3 therebetween. As shown in FIG. 1, an antenna patch 4, an IF circuit 5, and a connector 6 are formed on one side of the multilayer substrate 1. The IF circuit 5 corresponds to components from a band pass filter 27c to a baseband amplifier 27f of a receiver circuit 27 of a transmitter-receiver circuit illustrated in FIG. 4. As described above, a reception signal received by the antenna patch 4 (antenna 26) is mixed with a 5.835-GHz local oscillation signal from a local oscillator 22 by a mixer 27b of the receiver circuit 27, thus frequency-converting the reception signal into a 40-MHz IF signal. The IF signal passes through the band pass filter 27c and an IF amplifier 27d and is ASK-demodulated by a detector 27e, and the demodulated signal is amplified by the baseband amplifier 27f and output. Thus, there is a large frequency difference between the antenna patch 4 for transmitting and receiving 5.8-GHz frequency signals and the IF circuit 5 for operating at a frequency of 40 MHz. Even if the antenna patch 4 and the IF circuit 5 are arranged on the same side of the multilayer substrate 1, there is substantially no adverse effect on the radiation characteristics of the antenna. The antenna patch 4 is made of the same material as that of the conductive pattern 2 exposed at one side of the multilayer substrate 1. The conductive pattern 2 around the antenna patch 4 is removed by etching. The circuit components of the IF circuit 5 are soldered to this conductive pattern 2.

Referring to FIG. 2, a shield frame 7 is mounted on the other side of the multilayer substrate 1. The circuit components of the high frequency circuit excluding the IF circuit 5 are mounted in the space enclosed by the shield frame 7. Specifically, the circuit components (including a local oscillator 22, a modulation unit 23, and the mixer 27b) that may cause frequency interference with the antenna are arranged on the opposite side of the multilayer substrate 1 relative to the antenna patch 4. These circuit components are soldered to the conductive pattern 2 exposed at the other side of the multilayer substrate 1.

Referring to FIG. 3, of the conductive patterns 2 provided in the interior of the multilayer substrate 1, the conductive pattern 2 opposing the antenna patch 4 functions as a ground conductive pattern (hereinafter referred to as a ground conductive pattern 2A). The insulating layer 3 between the antenna patch 4 and the ground conductive pattern 2A is set to have a thickness large enough to obtain predetermined antenna characteristics. A feeding point of the antenna patch 4 and the circuit conductive pattern 2 formed on the other side of the multilayer substrate 1 conduct to each other through a through hole 8. Another conductive pattern (hereinafter referred to as a conductive pattern 2B) is provided between the conductive pattern 2 exposed at the antenna patch 4 side of the multiplayer substrate 1 and the ground conductive pattern 2A. At least an overlapping portion of the conductive pattern 2B, which overlaps the antenna patch 4, is removed. The conductive patterns 2 exposed at the corresponding sides of the multilayer substrate 1 and the ground conductive pattern 2A and the conductive pattern 2B in the interior of the multilayer substrate 1 conduct to one another through another through hole 8.

In the transmitter-receiver unit of the embodiment, there is a large frequency difference between the antenna patch 4 for transmitting and receiving 5.8-GHz frequency signals and the IF circuit 5 operating at a frequency of 40 MHz. By arranging the antenna patch 4 and the IF circuit 5 on one side of the multilayer substrate 1, miniaturization can be implemented while suppressing the adverse effect on the radiation characteristics of the antenna. Since power is fed at the feeding point of the antenna patch 4, which is provided on one side of the multilayer substrate 1, using the through hole 8, the cost can be reduced by the cost of a known antenna substrate, double-sided adhesive tape, and a feeding pin. Also, a soldered joint between the antenna patch 4 and the feeding point is prevented from cracking. The conductive pattern 2B is provided between the conductive pattern 2 exposed at the antenna patch 4 side of the multilayer substrate 1 and the ground conductive pattern 2A, and the conductive pattern 2B is prevented from overlapping with the antenna patch 4. Thus, the multilayer substrate 1 can be reduced in thickness.

ATTACHMENT A

| | |
|---|---|
| Guy W. Shoup | 26,805 |
| F. David AuBuchon | 20,493 |
| Gustavo Siller, Jr. | 32,305 |
| Jasper W. Dockrey | 33,868 |
| John C. Freeman | 34,483 |
| William F. Prendergast | 34,699 |
| Michael E. Milz | 34,880 |
| Paul E. Rauch | 38,591 |
| Tadashi Horie | 40,437 |
| Richard K. Clark | 40,560 |
| Joseph F. Hetz | 41,070 |
| Jason C. White | 42,223 |
| James A. Collins | 43,557 |
| Anthony P. Curtis | 46,193 |

What is claimed is:

1. A transmitter-receiver unit comprising:

a multilayer substrate formed by stacking a plurality of conductive patterns;

an antenna patch provided on a first side of the multilayer substrate;

an intermediate frequency (IF) circuit provided on the first side of the multilayer substrate;

a transmitter circuit provided on a second side of the multilayer substrate;

a receiver circuit provided on the second side of the multilayer substrate;

a transmission-reception switching circuit provided on the second side of the multilayer substrate; and a ground conductive pattern provided in an interior of the multilayer substrate, the ground conductive pattern opposing the antenna patch, wherein the antenna patch and a circuit conductive pattern provided on the second side of the multilayer substrate conduct to each other through a through hole.

2. A transmitter-receiver unit according to claim 1, wherein a conductive pattern not overlapping the antenna patch is formed between a conductive pattern exposed at the first side of the multilayer substrate and the ground conductive pattern.

3. A transmitter-receiver unit according to claim 1, wherein the antenna patch is formed by etching a portion of a conductive pattern exposed at the first side of the multilayer substrate.

* * * * *